United States Patent
Niu et al.

(10) Patent No.: US 10,141,158 B2
(45) Date of Patent: Nov. 27, 2018

(54) WAFER AND DUT INSPECTION APPARATUS AND METHOD USING THEREOF

(71) Applicant: TAIWAN SEMICONDUCTOR MANUFACTURING CO., LTD., Hsinchu (TW)

(72) Inventors: Bao-Hua Niu, Hsinchu (TW); Jung-Hsiang Chuang, Hsinchu (TW); David Hung-I Su, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/464,533

(22) Filed: Mar. 21, 2017

(65) Prior Publication Data

US 2018/0158647 A1   Jun. 7, 2018

Related U.S. Application Data

(60) Provisional application No. 62/429,959, filed on Dec. 5, 2016.

(51) Int. Cl.
| | |
|---|---|
| *H01J 37/10* | (2006.01) |
| *H01J 37/22* | (2006.01) |
| *H01J 37/16* | (2006.01) |
| *H01J 37/20* | (2006.01) |

(Continued)

(52) U.S. Cl.
CPC ............ *H01J 37/226* (2013.01); *H01J 37/06* (2013.01); *H01J 37/10* (2013.01); *H01J 37/16* (2013.01); *H01J 37/20* (2013.01); *H01J 37/244* (2013.01); *H01J 2237/2445* (2013.01)

(58) Field of Classification Search
CPC .. H01J 37/06; H01J 37/10; H01J 37/16; H01J 37/20; H01J 37/226; H01J 37/244; H01J 37/2445

See application file for complete search history.

(56) References Cited

U.S. PATENT DOCUMENTS

| | | | |
|---|---|---|---|
| 7,846,091 B2 * | 12/2010 | Fulghum | A61B 1/00009 600/160 |
| 2007/0023655 A1 * | 2/2007 | Nishikata | H01J 37/228 250/310 |

(Continued)

*Primary Examiner* — David E Smith
(74) *Attorney, Agent, or Firm* — McClure, Qualey & Rodack, LLP

(57) ABSTRACT

A wafer and DUT inspection apparatus and a wafer and DUT inspection method using thereof are provided. The apparatus includes a vacuum chamber, a stage, an electron gun, a lens system, an optical mirror and a detector. In the vacuum chamber, the stage is disposed near a first end, and the electron gun is disposed near a second end opposite to the first end. The lens system disposed between the stage and the electron gun is a total reflective achromatic lens system including a first lens and a second lens. The second lens having a second aperture is disposed between the electron gun and the first lens having a first aperture aligned with the second aperture. The optical mirror is disposed between the lens system and the electron gun. The detector is horizontally aligned with the optical mirror and configured to detect cathodoluminescence reflected from the optical mirror.

20 Claims, 9 Drawing Sheets

(51) Int. Cl.
*H01J 37/06* (2006.01)
*H01J 37/244* (2006.01)

(56) References Cited

U.S. PATENT DOCUMENTS

| | | | | |
|---|---|---|---|---|
| 2011/0226949 A1* | 9/2011 | Zeidler | ............... | H01J 37/09 |
| | | | | 250/310 |
| 2012/0193530 A1* | 8/2012 | Parker | ............ | G01N 21/6428 |
| | | | | 250/307 |
| 2013/0068966 A1* | 3/2013 | Kociak | ........... | G01N 23/2254 |
| | | | | 250/458.1 |
| 2013/0140459 A1* | 6/2013 | Galloway | ............ | H01J 37/02 |
| | | | | 250/310 |
| 2013/0321810 A1* | 12/2013 | Wang | ............... | G03F 7/70625 |
| | | | | 356/369 |

* cited by examiner

WAFER AND DUT INSPECTION APPARATUS AND METHOD USING THEREOF

RELATED APPLICATION

This application claims the benefit of the Provisional Application Ser. No. 62/429,959, filed Dec. 5, 2016. The entire disclosures of all the above applications are hereby incorporated by reference herein.

BACKGROUND

In the semiconductor technology, as technology node sizes decrease and integrated circuits (ICs) become smaller, a microscopic observation of a semiconductor wafer and/or a device under test (DUT) plays an important role for inspecting yield limiting defects, design functional defects and performance limiting defects. The microscopic observation is achieved by applying an infrared and/or a visible photon-laser to the semiconductor wafer or DUT. When the infrared and/or visible photon-laser are applied to the semiconductor wafer or DUT, the semiconductor wafer or DUT are excited and can emit luminescence. However, the resolution and the signal to noise ratio of an image formed by collecting the luminescence and/or reflected photons are too low to inspect the defects of smaller ICs features on the semiconductor wafer or DUT.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
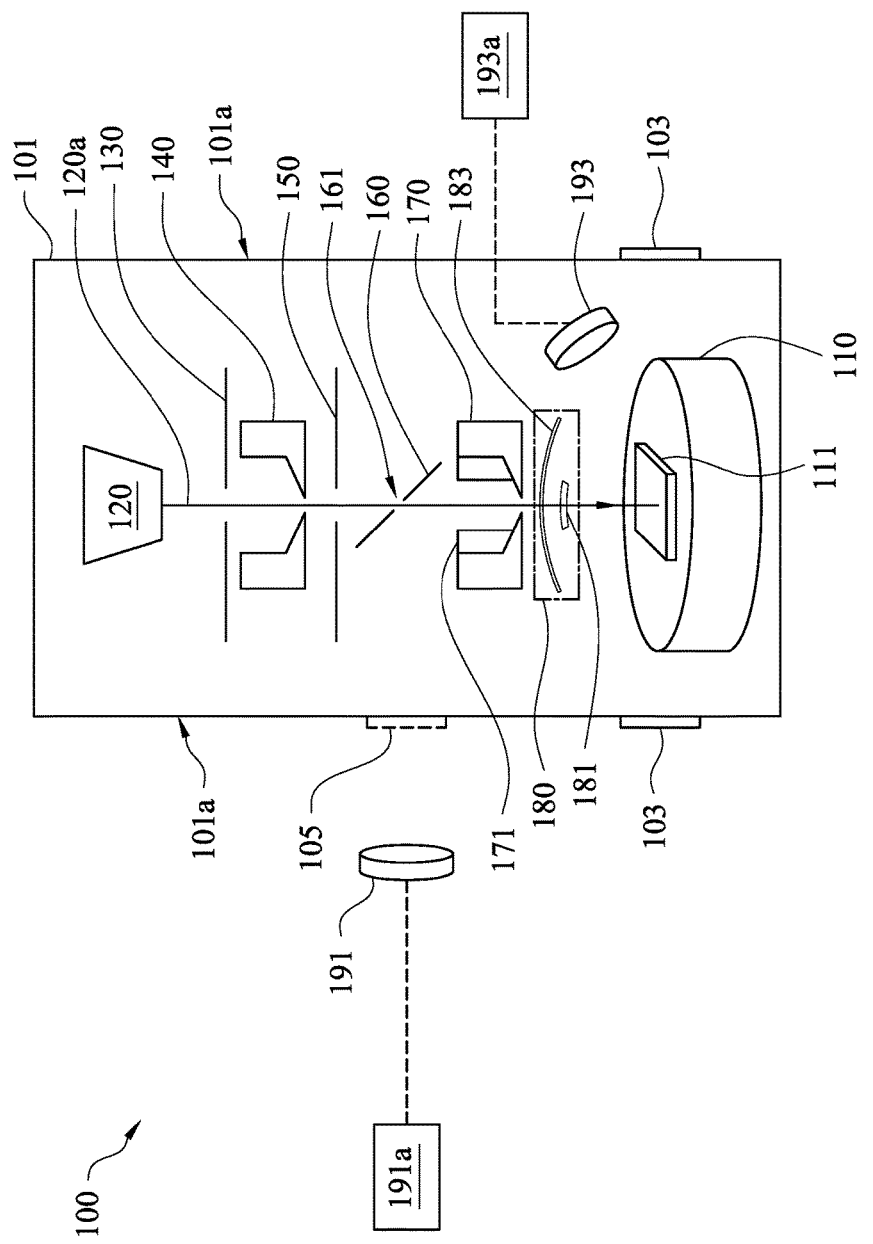
FIG. 1A is a schematic drawing of a wafer and DUT inspection apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Typically, for yield analysis, defect localization and analysis, functional debug and performance debug on flip chip semiconductor integrated circuits, an inspecting method, such as applying an infrared and visible laser scanning microscope (LSM) on a backside of a semiconductor wafer or a device under test (DUT), is utilized to inspect the semiconductor wafer or DUT. However, the resolution of this inspecting method is limited to 100 nm, and the inspecting method has a low signal to noise ratio, and thus is unable to clearly show the image of the semiconductor wafer or DUT with integrated circuits (ICs) feature devices as small as 10 nm.

Embodiments of the present disclosure are directed to a wafer and DUT inspection apparatus and a wafer and DUT inspection method. The wafer and DUT inspection apparatus is configured to instantly and quickly identify process yield limiting defects, design functional defects and performance limiting defects. In the wafer and DUT inspection apparatus, a semiconductor wafer or DUT is excited by a laser light and/or an electron-beam (E-Beam) so as to emit photoluminescence with laser excitation and cathodoluminescence with E-beam excitation. A detector is disposed to detect the luminescences, thereby forming a high-resolution image when the E-beam is used. Further, the wafer and DUT inspection method is performed to use the wafer and DUT inspection apparatus for inspecting the semiconductor wafer or DUT by forming a cathodoluminescence image with very high resolution approximately less than or equal to 1 nm in most of the case, and with very high signal to noise ratio.

Figure 1B:
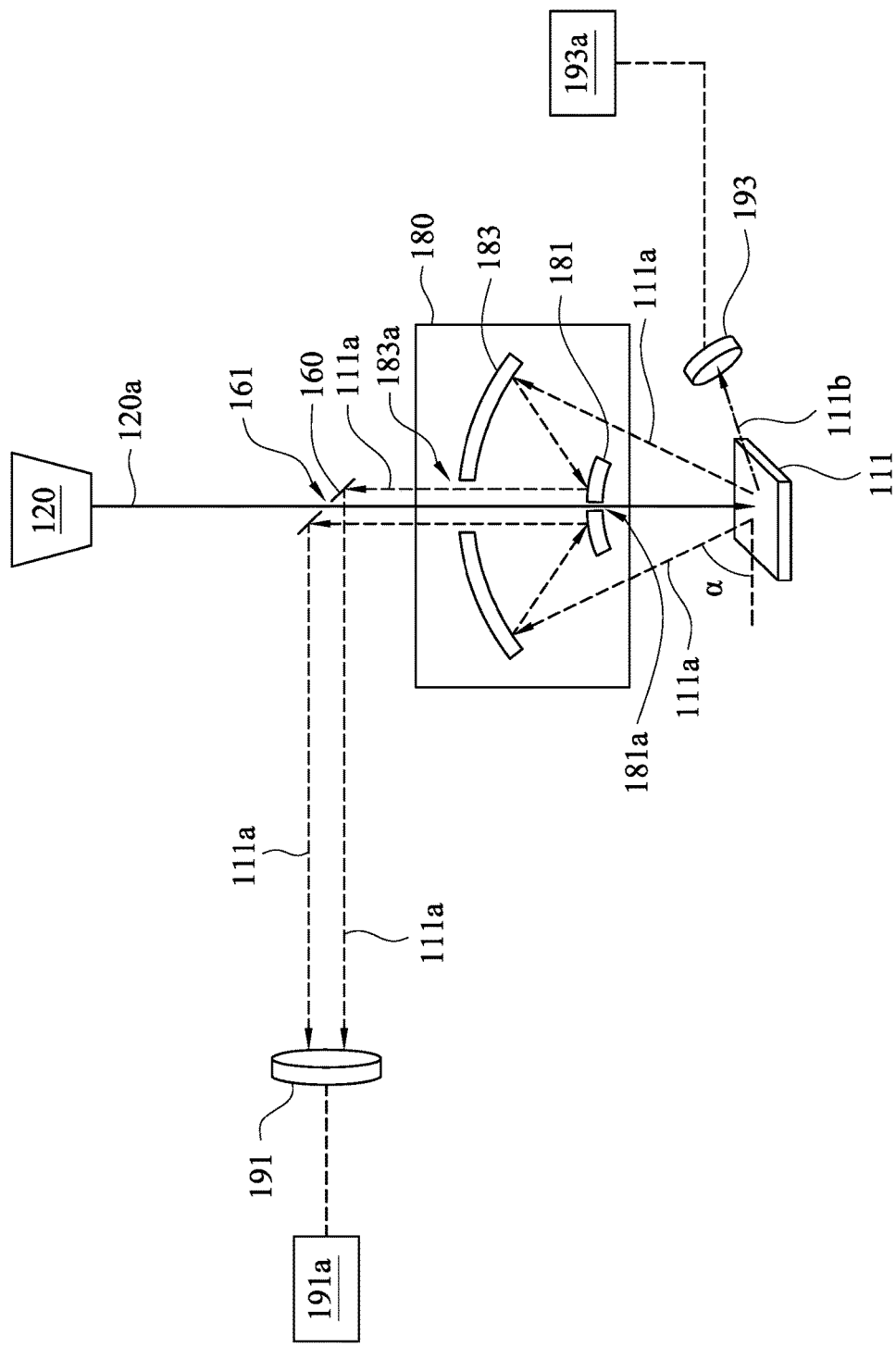
FIG. 1B shows a schematic drawing of a wafer and DUT inspection apparatus during an E-beam is applied to a semiconductor wafer or DUT in accordance with some embodiments of the present disclosure.

Referring to FIG. 1A and FIG. 1B. FIG. 1A is a schematic drawing of a wafer and DUT inspection apparatus 100 in accordance with some embodiments of the present disclosure. FIG. 1B shows a schematic drawing of the wafer and DUT inspection apparatus 100 during an E-beam 120*a* is applied to a semiconductor wafer (or DUT) 111 in accordance with some embodiments of the present disclosure. The apparatus 100 includes a vacuum chamber 101 and a detector 191. In the vacuum chamber 101, a stage 110 is disposed in the vacuum chamber 101 and near a first end of the vacuum chamber 101. An electron gun 120 is disposed in the vacuum chamber 101 and near a second end of the vacuum chamber 101, in which the second end is opposite to the first end. The E-beam 120a is provided by the electron gun 120. An optical mirror 160 having a slit 161 is disposed between the electron gun 120 and the stage 110. A lens system 180 is disposed between the optical mirror 160 and the stage 110. The lens system 180 is a total reflective achromatic lens system including a first lens 181 and a second lens 183. The second lens 183 is disposed between the optical mirror 160 and the first lens 181. In some embodiments, the first lens 181 is an aspherical lens or a spherical lens with an Al outside coating and a $SiO_2$ outside coating faced the second lens 183. In some embodiments, the second lens 183 is a spherical lens with an Al inside coating and a $SiO_2$ inside coating faced the first lens 181. The first lens 181 has a first aperture 181a, and the second lens 183 has a second aperture 183a. In some embodiments, the first aperture 181a and the second aperture 183a are disposed on an axis of the lens system 180. The first aperture 181a is aligned with the second aperture 183a. The slit 161 of the optical mirror 160 is aligned with the second aperture 183a. In some embodiments, an optical window 105 is disposed on a sidewall 101a of the vacuum chamber 101 and horizontally aligned with the optical mirror 160. The detector 191 is disposed outside the vacuum chamber 101 and horizontally aligned with the optical window 105. In some embodiments, a light reflected by the optical mirror 160 passes through the optical window 105 so as to be detected by the detector 191. In some embodiments, the detector 191 is disposed in the vacuum chamber 101 and horizontally aligned with the optical mirror 160.

For obtaining a better formation efficacy of an image, the vacuum chamber 101 includes an aperture 130, an electron condenser lens 140, a beam shaping aperture 150 and an electron objective lens 170 having a scan coil 171 in some embodiments. The aperture 130, the electron condenser lens 140 and the beam shaping aperture 150 are disposed between the electron gun 120 and the optical mirror 160. The electron condenser lens 140 is disposed between the aperture 130 and the beam shaping aperture 150. The electron objective lens 170 is disposed between the optical mirror 160 and the lens system 180. The aperture 130, the electron condenser lens 140 and the beam shaping aperture 150 are used to reduce a diameter of the E-beam 120a so as to form a smaller E-beam 120a. The E-beam 120a is focused by the electron objective lens 170, such that the E-beam 120a is applied to a surface of the semiconductor wafer (or DUT) 111 with a smaller spot size. In some embodiments, a focus of the E-beam 120a is located on the surface of the semiconductor wafer (or DUT) 111.

As shown in FIG. 1B. The E-beam 120a is applied to the surface of the semiconductor wafer (or DUT) 111 held on the stage 110 (as shown in FIG. 1A). In some embodiments, a backside thickness (a thickness of the side facing the incoming electron or photon beam) of the semiconductor wafer (or DUT) 111 is substantially thinned from 50 nm to 150 nm. In some embodiments, the thickness of the semiconductor wafer (or DUT) 111 is substantially 100 nm. The E-beam 120a is allowed to sequentially pass through the slit 161, the second aperture 183a and the first aperture 181a. In some embodiments, the E-beam 120a is continuously provided by the electron gun 120. In some embodiments, electron energy of the E-beam 120a is substantially from 200 eV to 1000 eV for obtaining the better formation efficacy. The semiconductor wafer (or DUT) 111 is excited to emit a cathodoluminescence 111a and a secondary electron 111b while the E-beam 120a is applied to the semiconductor wafer (or DUT) 111. The cathodoluminescence 111a is collected by the second lens 183 and reflected to the first lens 181, and then the cathodoluminescence 111a is reflected to pass through the second aperture 183a by the first lens 181. Thereafter, the cathodoluminescence 111a is reflected to detector 191 by the optical mirror 160 so as to form the image. In some embodiments, the detector 191 is disposed to receive the cathodoluminescence 111a reflected by the optical mirror 160. The detector 191 includes a photon detector in some embodiments. In some embodiments, the electron gun 120 is orthogonally aimed at the semiconductor wafer (or DUT) 111, such that the cathodoluminescence 111a emitted by the excited semiconductor wafer (or DUT) 111 is easily and efficiently collected by the second lens 183 of the lens system 180. The detector 191 is electrically connected to a processor 191a, thereby obtaining the image in some embodiments.

According to the image formed by collecting the cathodoluminescence, the defects of the semiconductor wafer (or DUT) are instantly and efficiently inspected so as to further analyze yield limiting and defect limiting. In some embodiments, the resolution of the obtained image is less than or equal to 1 nm while the electron energy of the E-beam 120a is 1000 eV.

During the cathodoluminescence 111a is emitted from the semiconductor wafer (or DUT) 111, the cathodoluminescence 111a is total-reflected by the first lens 181 and the second lens 183 so as to be guided to the detector 191. In some embodiments, a numerical aperture of the lens system 180 is substantially greater than or equal to 0.75. If the numerical aperture of the lens system 180 is less than 0.75, a cathodoluminescence collection of the lens system will decrease and the cathodoluminescence 111a will not be total-reflected to pass through the second aperture 183a. In some embodiments, the cathodoluminescence 111a is emitted with an angle α to the surface of the semiconductor wafer (or DUT) 111. When a distance between the lens system 180 and the surface of the semiconductor wafer (or DUT) 111 is decreased, the angle α is decreased and the numerical aperture of the lens system 180 is increased to collecting the cathodoluminescence. In some embodiments, the cathodoluminescence collection of the lens system 180 is greater than or equal to 50%. If the cathodoluminescence collection of the lens system 180 is less than 50%, the resolution of the obtained image will be low.

The secondary electron 111b emitted from the semiconductor wafer (or DUT) 111 is detected by a secondary electron detector 193 so as to form a secondary electron image. In some embodiments, the secondary electron detector 193 is electrically connected to a processor 193a, thereby obtaining the secondary electron image. The secondary electron image shows a surface morphology of the semiconductor wafer (or DUT) 111 in some embodiments.

Referring to FIG. 1A together with FIG. 1B. Plural electronic current channels 103 are respectively disposed on the sidewall 101a of the vacuum chamber 101 in some embodiments. The electronic current channels 103 allow electronic currents and voltages to be applied to the semiconductor wafer (or DUT) 111, thereby driving a semiconductor device on the semiconductor wafer (or DUT) 111. When the E-beam 120a is applied to the driving semiconductor device on the semiconductor wafer (or DUT) 111, the cathodoluminescence and secondary electron emitted from the observing area with the driving semiconductor device are different from that without applying the electronic currents and voltages to the semiconductor device due to the influence induced by the electronic currents and voltages on the cathodoluminescence and secondary electron, such that the functional defects and the performance defects of the semiconductor wafer (or DUT) 111 are inspected based on the images formed from the detectors 191 and 193.

Figure 2A:
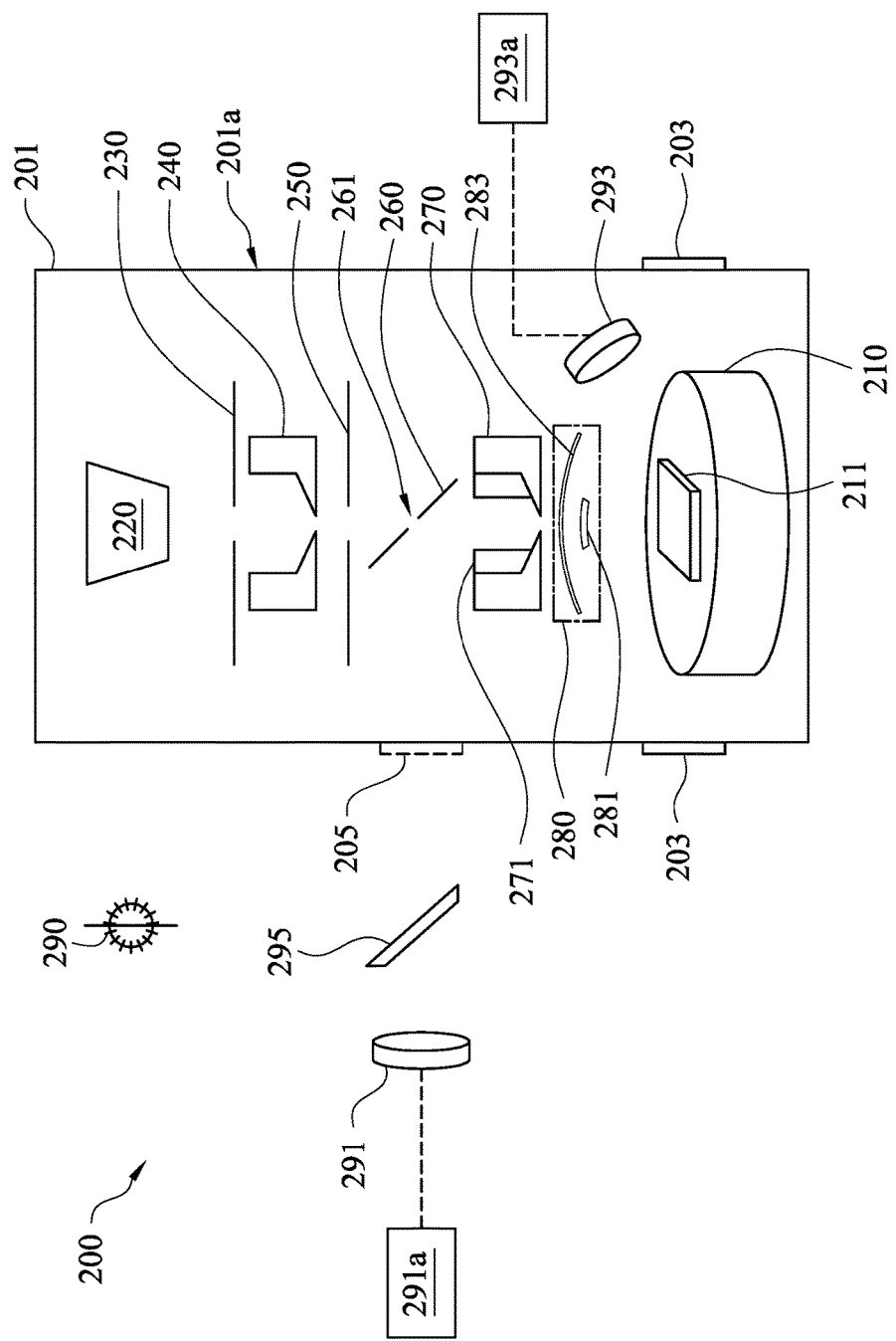
FIG. 2A is a schematic drawing of a wafer and DUT inspection apparatus in accordance with some embodiments of the present disclosure.
Figure 2B:
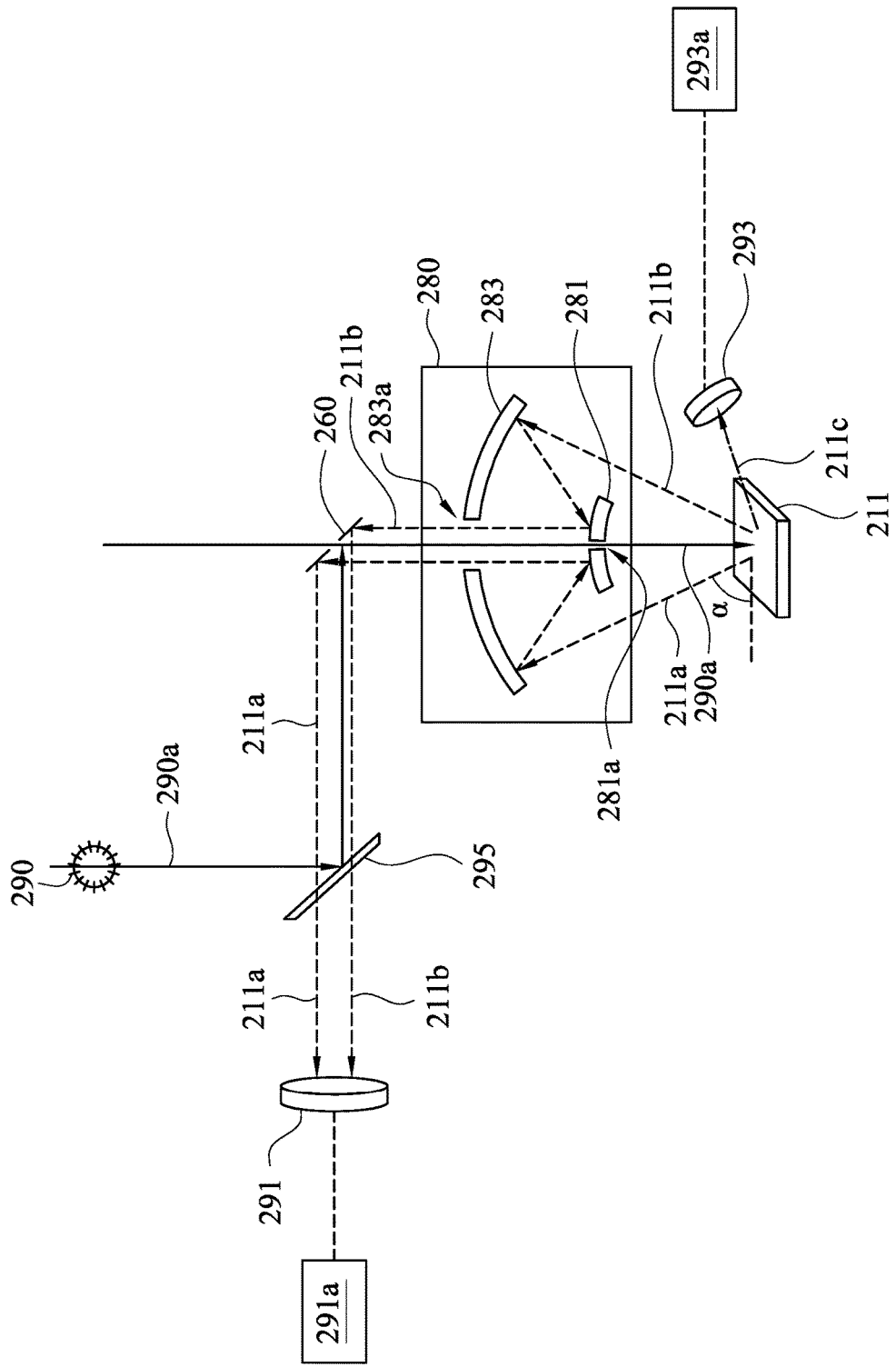
FIG. 2B and FIG. 2C show schematic drawings of a wafer and DUT inspection apparatus during a laser light or an E-beam is applied to a semiconductor wafer or DUT in accordance with some embodiments of the present disclosure.
Figure 2C:
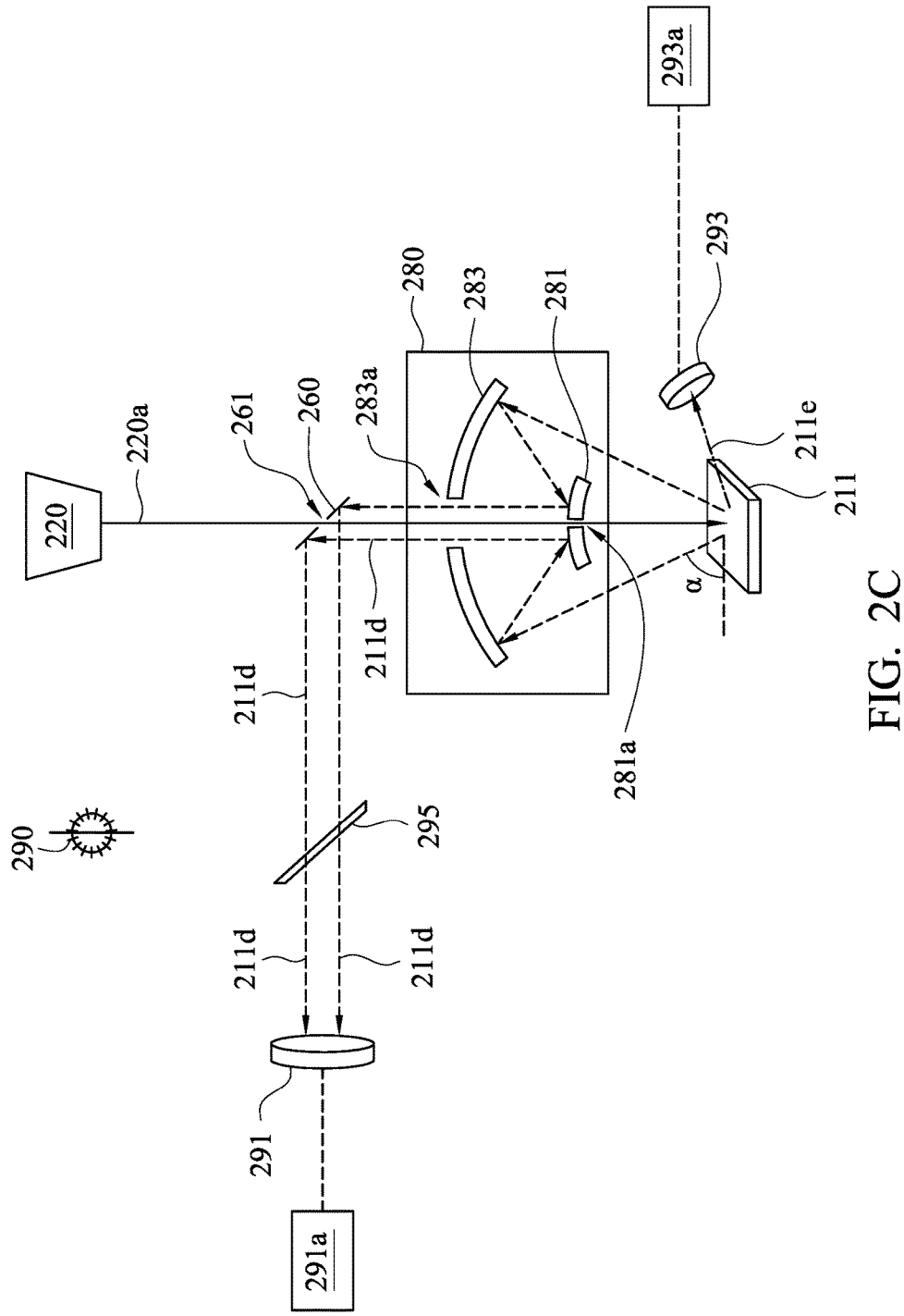
Figure 2D:
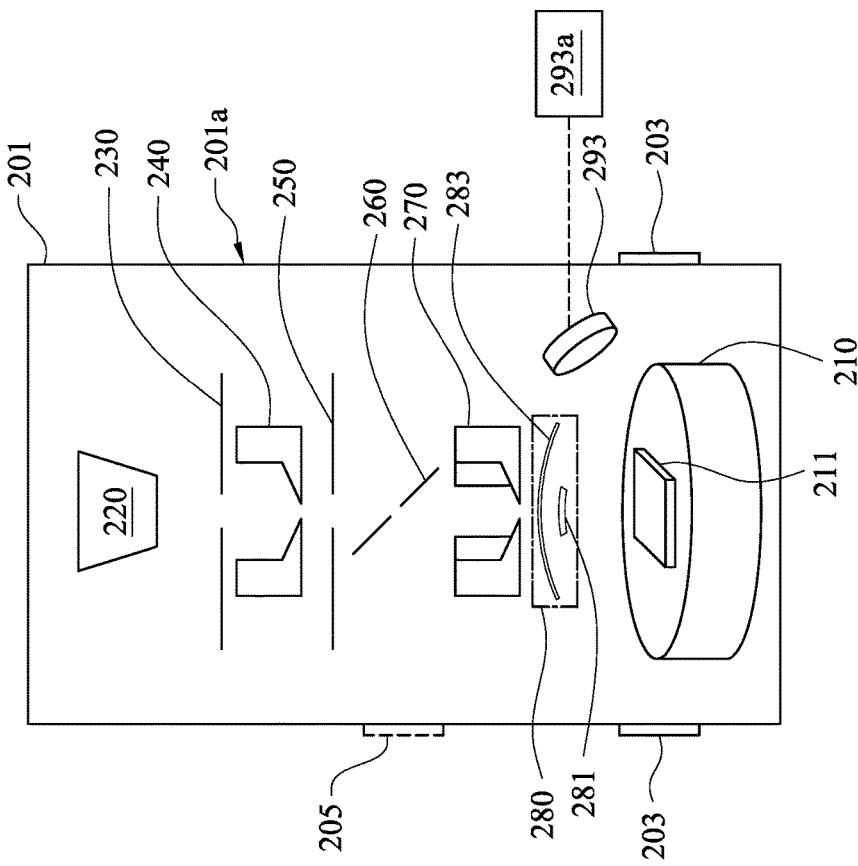
FIG. 2D is a schematic drawing of a wafer and DUT inspection apparatus in accordance with some embodiments of the present disclosure.
Figure 2D:
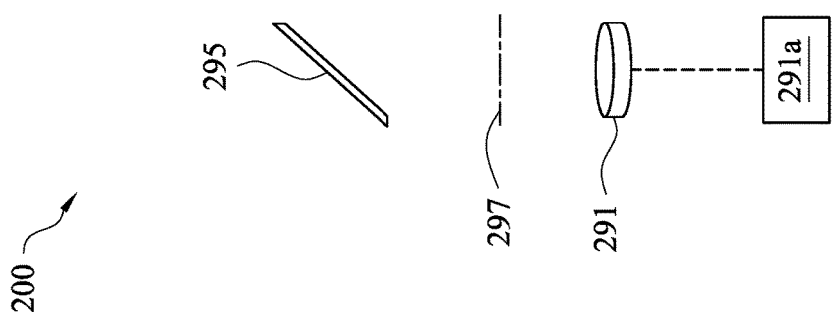
Figure 2E:
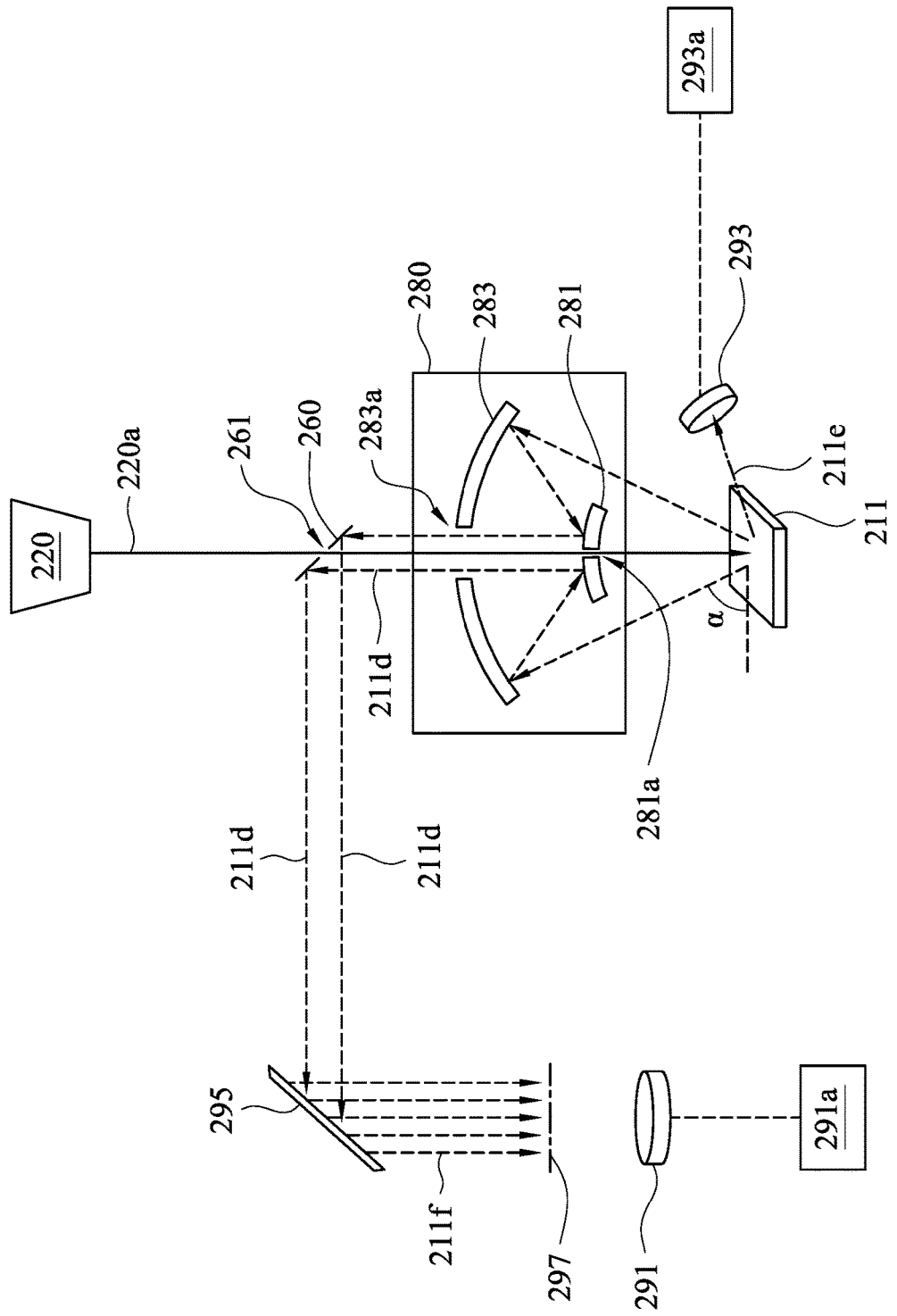
FIG. 2E show a schematic drawing of a wafer and DUT inspection apparatus during an E-beam is applied to a semiconductor wafer or DUT in accordance with some embodiments of the present disclosure.

Referring to FIG. 2A to FIG. 2E. FIG. 2A and FIG. 2D are schematic drawings of a wafer and DUT inspection apparatus 200 in accordance with some embodiments of the present disclosure. FIG. 2B, FIG. 2C and FIG. 2E show schematic drawings of the wafer and DUT inspection apparatus 200 during a laser light 290*a* or an E-beam 220*a* is applied to a semiconductor wafer (or DUT) 211 in accordance with some embodiments of the present disclosure. As shown in FIG. 2A. The apparatus 200 includes a vacuum chamber 201, a switchable optical element 295, a detector 291 and a laser source 290. In the vacuum chamber 201, a stage 210 is disposed in the vacuum chamber 201 and near a first end of the vacuum chamber 201. An electron gun 220 is disposed in the vacuum chamber 201 and near a second end of the vacuum chamber 201, in which the second end is opposite to the first end. An optical mirror 260 having a slit 261 is disposed between the electron gun 220 and the stage 210. A lens system 280 is disposed between the optical mirror 260 and the stage 210. The lens system 280 is a total reflective achromatic lens system including a first lens 281 and a second lens 283, in which the second lens 283 is disposed between the optical mirror 260 and the first lens 281. In some embodiments, the first lens 281 is an aspherical lens or a spherical lens with an Al outside coating and a $SiO_2$ outside coating faced the second lens 283. In some embodiments, the second lens 283 is a spherical lens with an Al inside coating and a $SiO_2$ inside coating faced the first lens 281. The first lens 281 has a first aperture 281*a*, and the second lens 283 has a second aperture 283*a*. The first aperture 281*a* is aligned with the second aperture 283*a*. The slit 261 of the optical mirror 260 is aligned with the second aperture 283*a*. An optical window 205 is disposed on a sidewall 201*a* of the vacuum chamber 201 and horizontally aligned with the optical mirror 260.

The switchable optical element 295 includes a dichroic mirror or a grating in some embodiments. The switchable optical element 295 is horizontally aligned with the optical window.

The detector 291 and the laser source 290 are disposed outside the vacuum chamber 201. The detector 291 and the laser source 290 are both aligned with the switchable optical element 295.

As shown in FIG. 2B. The laser source 290 emits a laser light 290*a* toward to the dichroic mirror (i.e. the switchable optical element 295). In this embodiments, a portion of the laser light 290*a* is reflected to the optical mirror 260 through the optical window 205 (shown as in FIG. 2A), and further reflected to the semiconductor wafer (or DUT) 211 through the second aperture 283*a* and the first aperture 281*a* by the optical mirror 260. When the laser light 290*a* is illuminated to the semiconductor wafer (or DUT) 211, the semiconductor wafer (or DUT) 211 is excited to emit a first photoluminescence 211*a* with some reflected photons 211*b* and a first secondary electron 211*c*. In some embodiments, a wavelength of the laser light 290*a* is substantially from 1064 nm to 600 nm.

The first photoluminescence 211*a* emitted from the semiconductor wafer (or DUT) 211 is collected and total-reflected to the first lens 281 by the second lens 283 of the lens system 280, and further reflected to the optical mirror 260 through the second aperture 283*a*, and then reflected to the dichroic mirror through the optical window 205. Thereafter, a portion of the first photoluminescence 211*a* passes through the dichroic mirror so as to be detected by the detector 291, thereby forming a first image. The detector 291 is electrically connected to a processor 291*a* so as to process electrical signals, thereby obtaining the first image. In some embodiments, a numerical aperture of the lens system 280 is substantially greater than or equal to 0.75. When the numerical aperture of the lens system 280 is less than 0.75, a photoluminescence collection of the lens system 280 decreases, such that the photoluminescence 211*a* is unable to be total-reflected by the lens system 280. In some embodiments, the photoluminescence 211*a* is emitted with an angle α to the surface of the semiconductor wafer (or DUT) 211. When a distance between the lens system 280 and the surface of the semiconductor wafer (or DUT) 211 is decreased, the angle α is decreased and the numerical aperture of the lens system 280 is increased to collecting the photoluminescence. In some embodiments, the photoluminescence collection of the lens system is substantially greater than or equal to 50%. When the photoluminescence collection of the lens system 280 is less than 50%, a formation efficacy of the first image is low so as to decrease the resolution of the first image.

In this embodiment, the laser light 290*a* has a large diameter, such that a large area of the semiconductor wafer (or DUT) 211 is illuminated by the laser light 290*a*. Thus, the first image formed from the first photoluminescence 211*a* shows the large area of the semiconductor wafer (or DUT) 211 so as to perform a positioning process, thereby positioning an observing area of the semiconductor wafer (or DUT) 211.

As shown in FIG. 2C. The laser source 290 is stopped emitting the laser light 290*a* (shown as in FIG. 2B), and the electron gun 220 starts emitting the E-beam 220*a* toward to the semiconductor wafer (or DUT) 211 so as to perform an inspecting process. The E-beam 220*a* is allowed to pass through the slit 261 of the optical mirror 260, the second aperture 283*a* and the first aperture 281*a*, such that the E-beam 220*a* is applied to the semiconductor wafer (or DUT) 211. According to the positioning process, the observing area is adjusted to be illuminated with the E-beam 220*a*. In some embodiments, a backside thickness of the semiconductor wafer (or DUT) 211 is substantially thinned from 50 nm to 150 nm, and electron energy of the E-beam 220*a* is substantially from 200 eV to 1000 eV for obtaining the better formation efficacy. In some embodiments, the E-beam 220*a* is orthogonally applied to the observing area for enhancing a cathodoluminescence collecting efficiency. In some embodiments, the E-beam 220*a* is continuously applied to the observing area of the semiconductor wafer or DUT. When the observing area is illuminated by the E-beam 220*a*, the observing area is excited to emit a second cathodoluminescence 211*d* and a second secondary electron 211*e*. The second cathodoluminescence 211*d* is collected and total-reflected to the first lens 281 by the second lens 283, and further reflected to the optical mirror 260 through the second aperture 283*a*, and then reflected to the dichroic mirror through the optical window 205 (shown as in FIG. 2A). Thereafter, a portion of the second cathodoluminescence 211*d* passes through the dichroic mirror so as to be detected by the detector 291, thereby forming a second image. Similarly, the second cathodoluminescence 211*d* is detected and converted to electrical signals by the detector, and then the electrical signals are processed by the processor 291*a* so as to obtain the second image. The observing area of the semiconductor wafer (or DUT) 211 is subjected to an inspecting process according to the second image so as to instantly and efficiently inspect defects on the observing area. For example, the resolution of the second image is less than or equal to 1 nm while the electron energy of the E-beam 220a is 1000 eV. In some embodiments, the cathodoluminescence emitted by the E-beam 220a achieves high bandwidth application up to 12 GHz.

In some embodiments, plural electronic current and voltage channels are respectively disposed on the sidewall 201a of the vacuum chamber 201. After the positioning process is performed, plural electronic currents and voltages are applied to a semiconductor device on the observing area of the semiconductor wafer (or DUT) 211, thereby driving the semiconductor device. When the E-beam 220a is applied to the driving semiconductor device on the observing area of the semiconductor wafer (or DUT) 211, the cathodoluminescence and secondary electrons emitted from the observing area with the driving semiconductor device are different from that without applying the electronic currents and voltages to the semiconductor device. In some embodiments, the electronic currents and voltages influence a wavelength and an intensity of the emitted cathodoluminescence, such that images formed by collecting the cathodoluminescence and secondary electrons are varied. Thus, the image clearly shows performance defects and functional defects of the semiconductor device of the semiconductor wafer (or DUT) 211.

In some embodiments, the dichroic mirror is switched to a grating (i.e. the switchable optical element 295) after the positioning process is performed, as shown in FIG. 2D. In some embodiments, the grating includes a reflecting grating. Further, a band-selection slit 297 is disposed between the grating and the detector 291. According to the difference of the optical path between the dichroic mirror and the grating, the detector 291 is moveable to efficiently detect the cathodoluminescence guided by the dichroic mirror or the grating.

As shown in FIG. 2E. After the switchable optical element is switched, the E-beam 220a is continuously applied to the observing area of the semiconductor wafer (or DUT) 211, such that the excited observing area emits the second cathodoluminescence 211d and the second secondary electron 211e. The second cathodoluminescence 211d is collected and guided to the grating by the lens system 280 and the optical mirror 260. When the second cathodoluminescence 211d is guided to the grating, the second cathodoluminescence 211d is diffracted to plural luminescence 211f. Based on a selected band of the band-selection slit 297, suitable luminescence pass through the band-selection slit 297 so as to be detected by the detector 291, thereby forming a third image. The third image shows defects of the observing area of the semiconductor wafer (or DUT) 211, such that the semiconductor wafer (or DUT) 211 is quickly and efficiently inspected.

In some embodiments, after the positioning process is performed, the electric currents and voltages are applied to a semiconductor device on the observing area of the semiconductor wafer (or DUT) 211 so as to drive the semiconductor device. The cathodoluminescence emitted from the observing area with the driving semiconductor device is influenced by functions of the semiconductor device, such that the image formed by collecting the cathodoluminescence is different from the third image without applying the electric currents and voltages.

Figure 3A:
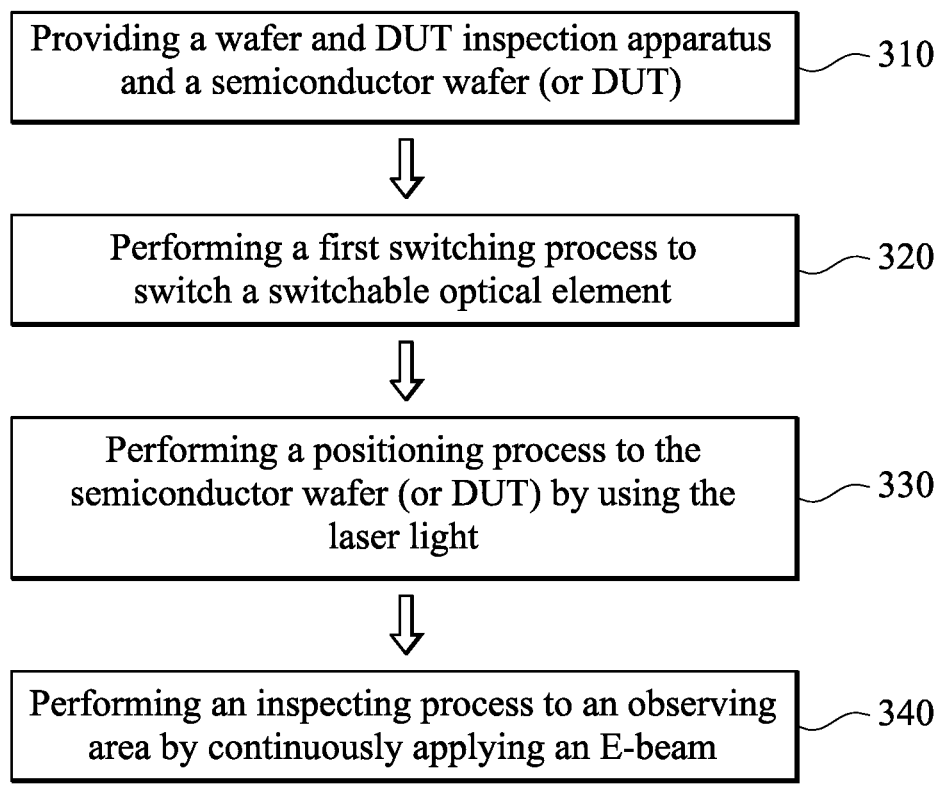
FIG. 3A and FIG. 3B are flow charts showing a wafer and DUT inspection method according to certain embodiments of the present disclosure.

Referring to FIG. 3A together with FIG. 2A to FIG. 2C. FIG. 3A is a flow chart showing a wafer and DUT inspection method according to certain embodiments of the present disclosure. At operation 310, a wafer and DUT inspection apparatus 200 and a semiconductor wafer (or DUT) 211 are provided. The apparatus 200 includes a vacuum chamber 201, a switchable optical element 295, a detector 291 and a laser source 290. In the vacuum chamber 201, a stage 210 is disposed in the vacuum chamber 201 and near a first end of the vacuum chamber 201. An electron gun 220 is disposed in the vacuum chamber 201 and near a second end of the vacuum chamber 201, in which the second end is opposite to the first end. An optical mirror 260 having a slit 261 is disposed between the electron gun 220 and the stage 210. A lens system 280 is disposed between the optical mirror 260 and the stage 210. The lens system 280 is a total reflective achromatic lens system including a first lens 281 and a second lens 283, in which the second lens 283 is disposed between the optical mirror 260 and the first lens 281. In some embodiments, the first lens 281 is an aspherical lens or a spherical lens with an Al outside coating and a $SiO_2$ outside coating faced the second lens 283. In some embodiments, the second lens 283 is a spherical lens with an Al inside coating and a $SiO_2$ inside coating faced the first lens 281. The first lens 281 has a first aperture 281a, and the second lens 283 has a second aperture 283a. The first aperture 281a is aligned with the second aperture 283a. The slit 261 of the optical mirror 260 is aligned with the second aperture 283a. An optical window 205 is disposed on a sidewall 201a of the vacuum chamber 201 and horizontally aligned with the optical mirror 260. The switchable optical element 295 is horizontally aligned with the optical window 205. The switchable optical element 295 includes a dichroic mirror or a grating in some embodiments. The detector 291 and the laser source 290 are disposed outside the vacuum chamber 201. The detector 291 and the laser source 290 are both aligned with the switchable optical element 295. The semiconductor wafer (or DUT) 211 is provided onto the stage 210. In some embodiments, a backside thickness of the semiconductor wafer (or DUT) 211 is substantially thinned from 50 nm to 150 nm. In some embodiments, the thickness of the semiconductor wafer (or DUT) 111 is substantially 100 nm.

At operation 320, the switchable optical element 295 is subjected to a first switching process to switch to the dichroic mirror so as to further perform a positioning process. According to a light-guiding path of the dichroic mirror, the detector 291 is adjusted to a position where a light guided by the dichroic mirror is efficiently collected by the detector 291.

At operation 330, a positioning process is performed to the semiconductor wafer (or DUT) 211 by using a laser light 290a. The laser source 290 emits a laser light 290a toward to the dichroic mirror during the positioning process. Further, a portion of the laser light 290a is reflected to the semiconductor wafer (or DUT) 211 through the second aperture 283a and the first aperture 281a by the dichroic mirror and the optical mirror 260. When the laser light 290a illuminates the semiconductor wafer (or DUT) 211, the excited semiconductor wafer (or DUT) 211 emits a first photoluminescence 211a with some reflected photons 211b and a first secondary electron 211c. The first photoluminescence 211a is collected and total-reflected to optical mirror 260 through the second aperture 283a by the first lens 281 and the second lens 283, and then the first photoluminescence 211a is reflected to the dichroic mirror. Thereafter, a portion of the first photoluminescence 211a passes through the dichroic mirror so as to be detected by the detector 291, thereby forming a first image. In some embodiments, the detector 291 is electrically connected to a processor 291a, thereby obtaining the first image.

Because the semiconductor wafer (or DUT) 211 is illuminated by the laser light 290a with a large diameter, the first image shows a large area of the semiconductor wafer (or DUT) 211. Thus, an anticipated observing area of the semiconductor wafer (or DUT) 211 is quickly and efficiently found.

At operation 340, an inspecting process is performed to the observing area by continuously applying an E-beam 220a. The laser source 290 is stopped emitting the laser light 290a, and the electron gun 220 starts emitting the E-beam 220a toward to the semiconductor wafer (or DUT) 211 during the inspecting process. The E-beam 220a is allowed to pass through the slit 261 of the optical mirror 260, the second aperture 283a and the first aperture 281a. In some embodiments, the E-beam 220a is orthogonally applied to the observing area of the semiconductor wafer or DUT 211. In some embodiments, the E-beam 220a is continuously applied to the semiconductor wafer (or DUT) 211. In some embodiment, electron energy of the E-beam 120a is substantially from 200 eV to 1000 eV. The E-beam 220a is accurately applied to the observing area due to a smaller and focused diameter of the E-beam 220a. The excited observing area of the semiconductor wafer (or DUT) 211 emits a second cathodoluminescence 211d and a second secondary electron 211e. The second cathodoluminescence 211d is collected and total-reflected to the optical mirror 260 through the second aperture 283a by the first lens 281 and the second lens 283, and then the second cathodoluminescence 211d is reflected to the dichroic mirror by the optical mirror 260. Thereafter, a portion of the second cathodoluminescence 211d passes through the dichroic mirror so as to be detected and converted to electrical signals by the detector 291. In some embodiments, the electrical signals are processed by the processor 291a, thereby obtaining the second image. In some embodiments, the resolution of the second image is substantially less than or equal to 1 nm due to a high cathodoluminescence collection of the lens system 280 (for example not less than 50%). Accordingly, the second image with the high resolution efficiently and accurately shows defects on the anticipated observing area of the semiconductor wafer or DUT. For example, the resolution of the second image is less than or equal to 1 nm when the electron energy is 1000 eV. In some embodiments, the detector includes a high speed infrared detector for achieving high bandwidth application up to 12 GHz. In some embodiments, the semiconductor wafer (or DUT) 211 is moved after the inspecting process is performed, and the positioning process and the inspecting process is repeated to be performed to another area of the semiconductor wafer (or DUT) 211.

In some embodiments, after the inspecting process is performed, electronic currents and voltages can be applied to the observing area of the semiconductor wafer (or DUT) 211, thereby driving a semiconductor device on the observing area. Then, the inspection process is repeated. When the E-beam 220a is applied to the driving semiconductor device on the observing area, the cathodoluminescence emitted from the observing area is influenced by the electronic currents and voltages, such that a wavelength and an intensity of the cathodoluminescence are varied. Therefore, based on variations of the cathodoluminescence, the performance defects and the functional defects are instantly and efficiently inspected. After the observing area with the driving is inspected, the semiconductor wafer (or DUT) 211 can be moved, such that the positioning process and the inspecting process can be sequentially performed to a new area of the semiconductor (or DUT) 211, and further the electronic currents and voltages can be applied to the new area to drive a new semiconductor device so as to inspect the new driving semiconductor device.

Figure 3B:
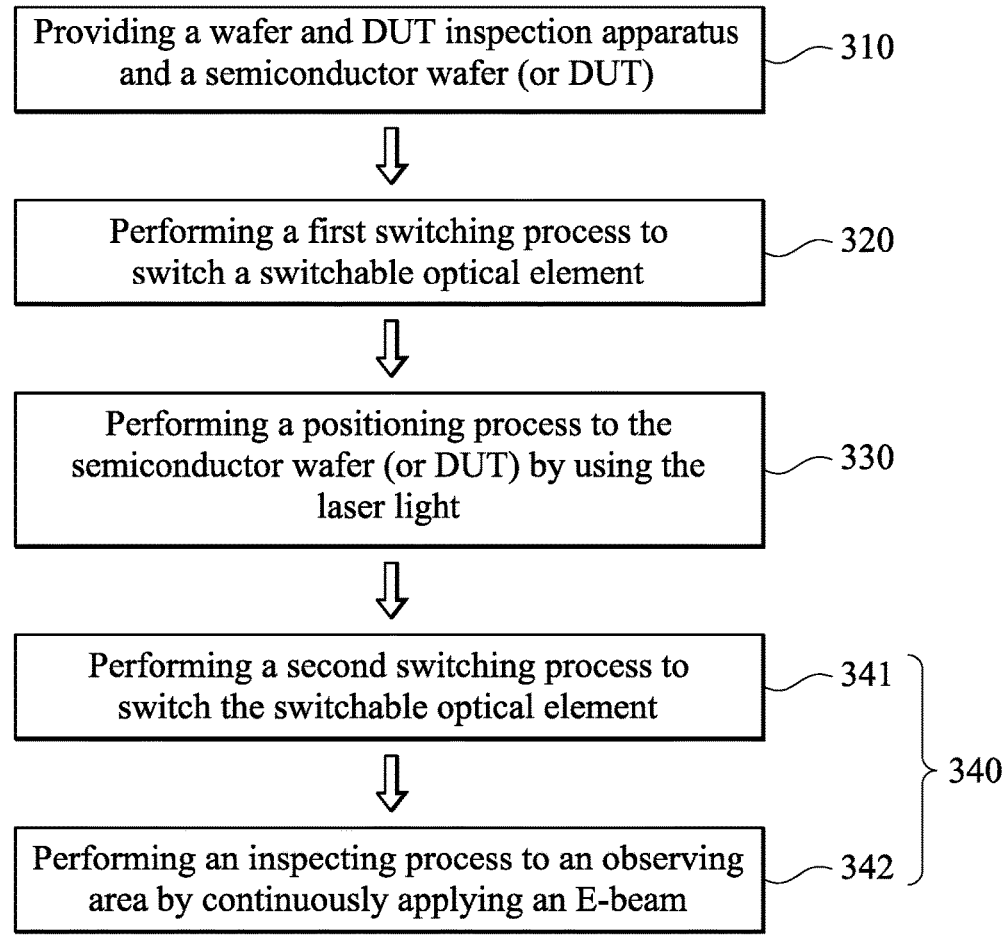

Referring to FIG. 3B together with FIG. 2A, FIG. 2B, FIG. 2D, FIG. 2E and FIG. 3A. FIG. 3B is a flow chart showing a wafer and DUT inspection method according to certain embodiments of the present disclosure. The operation 340 further includes a sub-operation 341 and a sub-operation 342. At sub-operation 341, a second switching process is performed to switch the dichroic mirror (i.e. the switchable optical element, shown as in FIG. 2A and FIG. 2B) to the grating (i.e. the switchable optical element, shown as in FIG. 2D and FIG. 2E). According to a light-guiding path of the grating, the detector 291 is adjusted to a position where a light guided by the grating is efficiently collected by the detector 291. In some embodiments, a band-selection slit 297 is disposed between the grating and the detector 291.

At sub-operation 342, the E-beam 220a is continuously applied to the observing area of the semiconductor wafer (or DUT) 211 so as to perform an inspecting process, such that the second cathodoluminescence 211d is emitted from the excited observing area. The E-beam 220a is continuously applied to the observing area in some embodiments. Then, the second cathodoluminescence 211d is collected and total-reflected by the lens system 280 and the optical mirror 260. Thereafter, a third image is formed by collecting the second cathodoluminescence 211d reflected by the grating. According to the third image, the observing area of the semiconductor wafer (or DUT) 211 is observed, thereby inspecting the defects of the observing area. In some embodiments, after the sub-operation 342 is performed, the semiconductor (or DUT) 211 can be moved, such that the operation 320 to operation 340 are repeated to be performed to another area of the semiconductor wafer (or DUT) 211.

In some embodiments, after the positioning process and/or the inspecting process are performed, electronic currents and voltages are applied to a semiconductor device on the observing area of the semiconductor wafer or DUT, thereby driving the semiconductor device. Then, the inspecting process is performed. When the E-beam 220a is applied to the observing area, the cathodoluminescence emitted from the observing area with the driving semiconductor device is influenced by the electronic currents and voltages so as to vary a wavelength and an intensity of the cathodoluminescence, such that the cathodoluminescence with applying the electronic currents and voltages is different from that emitted from the observing area without applying the electronic currents and voltages. Therefore, the performance defects and the functional defects are instantly and efficiently inspected by the obtained image. And then, the semiconductor wafer (or DUT) 211 can be moved, and the operation 320 to operation 340 are repeated to be performed to a new area, in some embodiments. Similarly, electronic currents and voltages can be applied to a semiconductor device on the new area so as to inspect the performance defects and the functional defects.

It can be understood that some embodiments of the present disclosure provide the wafer and DUT inspection apparatus. The wafer and DUT inspection apparatus efficiently collects the cathodoluminescence with the lens system having higher numerical aperture, thereby improving the resolution and the signal to noise ratio of the formed image. Further, it can be understood that some embodiments of the present disclosure provide the wafer and DUT inspection method. The laser light is utilized to quickly position the observing area of the semiconductor wafer or DUT during the positioning process, and the E-beam is continuously and coaxially applied to the observing area during the inspecting process. Thereafter, the observing wafer or DUT is excited to emit the cathodoluminescence.

It is noted that the wafer and DUT inspection apparatus and the wafer and DUT inspection method utilizing thereof are not limited to the above embodiments of present disclosure. The wafer and DUT inspection apparatus and the wafer and DUT inspection method can be applied in nano-materials application including nano-scale analyses and other nano-scale biomedical and chemical analyses.

In accordance with an embodiment of the present disclosure, the present disclosure discloses a wafer and DUT inspection apparatus. The wafer and DUT inspection apparatus includes a vacuum chamber, a stage, an electron gun, a lens system, an optical mirror and a detector. The stage is disposed in the vacuum chamber and near a first end of a vacuum chamber, and the stage is configured to hold a wafer or DUT. The electron gun is disposed in the vacuum chamber and near a second end of the vacuum chamber. The first end is opposite to the second end. The electron gun is configured to provide an E-beam. The lens system is disposed between the stage and the electron gun. The lens system is a total reflective achromatic lens system having a first lens and a second lens. The second lens is disposed between the electron gun and the first lens. The first lens has a first aperture, and the second lens has a second aperture aligned with the first aperture. The optical mirror is disposed between the lens system and the electron gun. The optical mirror has a slit aligned with the second aperture, thereby allowing the E-beam to pass through the slit, the first aperture and the second aperture. The detector is horizontally aligned with the optical mirror and configured to detect a cathodoluminescence reflected from the optical mirror for forming an image.

In accordance with another embodiment of the present disclosure, the present disclosure discloses a wafer and DUT inspection apparatus. The wafer and DUT inspection apparatus includes a vacuum chamber, a switchable optical element, a detector and a laser source. The vacuum chamber includes a stage, an electron gun, a lens system, an optical mirror and an optical window. The stage is disposed in the vacuum chamber and near a first end of the vacuum chamber, and the stage in configured to hold a wafer or DUT. The electron gun is disposed in the vacuum chamber and near a second end of the vacuum chamber. The first end is opposite to the second end. The electron gun is configured to provide an E-beam. The lens system is disposed between the stage and the electron gun. The lens system is a total reflective achromatic lens system having a first lens and a second lens. The second lens is disposed between the electron gun and the first lens. The first lens has a first aperture, and the second lens has a second aperture aligned with the first aperture. The optical mirror is disposed between the lens system and the electron gun. The optical mirror has a slit aligned with the second aperture, thereby allowing the E-beam to pass through the slit, the first aperture and the second aperture. The optical window is disposed on a sidewall of the vacuum chamber and horizontally aligned with the optical window. The switchable optical element is horizontally aligned with the optical window and configured to guide a cathodoluminescence reflected from the optical mirror. The detector is disposed outside the vacuum chamber and aligned with the switchable optical element. The detector is configured to detect the cathodoluminescence. The laser source is disposed outside the vacuum chamber. The laser source is configured to emit laser light toward to the switchable optical element. The laser light is guided to the optical mirror by the switchable optical element and allowed to pass through the first aperture and the second aperture.

In accordance with another embodiment of the present disclosure, the present disclosure discloses a wafer and DUT inspection method. A wafer and DUT inspection apparatus is firstly provided. The wafer and DUT inspection apparatus includes a vacuum chamber, a switchable optical element, a detector and a laser source. The stage is disposed in the vacuum chamber and near a first end of the vacuum chamber. The electron gun is disposed in the vacuum chamber and near a second end of the vacuum chamber. The first end is opposite to the second end. The lens system is disposed between the stage and the electron gun. The lens system is a total reflective achromatic lens system having a first lens and a second lens. The second lens is disposed between the electron gun and the first lens. The first lens has a first aperture, and the second lens has a second aperture aligned with the first aperture. The optical mirror is disposed between the lens system and the electron gun. The optical mirror has a slit aligned with the second aperture. The switchable optical element is switched between a dichroic mirror and a grating. The switchable optical element is horizontally aligned with the optical window and configured to guide cathodoluminescence reflected from the optical mirror. The detector is aligned with the switchable optical element and configured to detect the cathodoluminescence. The laser source is aligned with the switchable optical element for emitting laser light toward to the switchable optical element, and the laser light is guided to the optical mirror by the switchable optical element. Next, the semiconductor wafer or DUT is placed on the stage. Then, a first switching process is performed to the switchable optical element so as to switch the switchable optical element to the dichroic mirror. After the switching process is performed, a positioning process is performed to the semiconductor wafer or DUT by using the laser light. A first luminescence emitted from an excited area of the semiconductor wafer or DUT is guided to the detector so as to form a first image, thereby positioning an observing area of the semiconductor wafer or DUT. And then, an inspecting process is performed to the observing area by continuously applying the E-beam so as to excite the observing area to emit a second luminescence. The second luminescence is guided to the detector for forming a second image.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A wafer and a device under test (DUT) inspection apparatus, comprising:
  a vacuum chamber;
  a stage disposed in the vacuum chamber and near a first end of the vacuum chamber, wherein the stage is configured to hold a wafer or DUT;

an electron gun disposed in the vacuum chamber and near a second end of the vacuum chamber opposite to the first end for providing an E-beam;

a lens system disposed between the stage and the electron gun, wherein the lens system is a total reflective achromatic lens system comprising:

a first lens having a first aperture; and a second lens having a second aperture aligned with the first aperture, the second lens is disposed between the electron gun and the first lens;

an optical mirror disposed between the lens system and the electron gun, wherein the optical mirror has a slit aligned with the second aperture, thereby allowing the E-beam to pass through the slit, the first aperture and the second aperture;

a beam shaping aperture disposed between the electron gun and the optical mirror;

a grating horizontally aligned with the optical mirror and configured to reflect towards the detector cathodoluminescence reflected from the optical mirror; and a detector aligned with the grating, wherein the detector is configured to detect the cathodoluminescence for forming an image.

2. The apparatus of claim 1, further comprising:

a plurality of electronic current channels respectively disposed on the sidewall of the vacuum chamber.

3. The apparatus of claim 1, wherein the electron gun is orthogonally aimed at the wafer or DUT.

4. The apparatus of claim 1, wherein the first aperture and the second aperture are disposed on an axis of the lens system.

5. The apparatus of claim 1, wherein a numerical aperture of the lens system is substantially greater than or equal to 0.75.

6. The apparatus of claim 1, wherein a cathodoluminescence collection of the lens system is substantially greater than or equal to 50%.

7. The apparatus of claim 1, wherein the detector comprises a photon detector.

8. A wafer and a device under test (DUT) inspection apparatus, comprising:

a vacuum chamber, comprising:

a stage disposed in the vacuum chamber and near a first end of the vacuum chamber, wherein the stage is configured to hold a wafer or DUT;

an electron gun disposed in the vacuum chamber and near a second end of the vacuum chamber opposite to the first end for providing an E-beam;

a lens system disposed between the stage and the electron gun, wherein the lens system is a total reflective achromatic lens system comprising:

a first lens having a first aperture; and a second lens having a second aperture aligned with the first aperture, the second lens is disposed between the electron gun and the first lens;

an optical mirror disposed between the lens system and the electron gun, wherein the optical mirror has a slit aligned with the second aperture, thereby allowing the E-beam to pass through the slit, the first aperture and the second aperture; and an optical window disposed on a sidewall of the vacuum chamber and horizontally aligned with the optical mirror;

a switchable optical element horizontally aligned with the optical window and configured to guide cathodoluminescence reflected from the optical mirror;

a detector disposed outside the vacuum chamber and aligned with the switchable optical element, wherein the detector is configured to detect the cathodoluminescence for forming an image; and a laser source disposed outside the vacuum chamber and aligned with the switchable optical element for emitting laser light toward to the switchable optical element, wherein the laser light is guided to the optical mirror by the switchable optical element and allowed to pass through the first aperture and the second aperture.

9. The apparatus of claim 8, further comprising:

a plurality of electronic current channels respectively disposed on the sidewall of the vacuum chamber.

10. The apparatus of claim 8, wherein the electron gun is orthogonally aimed at the wafer or DUT.

11. The apparatus of claim 8, wherein the first aperture and the second aperture are disposed on an axis of the lens system.

12. The apparatus of claim 8, wherein a numerical aperture of the lens system is substantially greater than or equal to 0.75.

13. The apparatus of claim 8, wherein a cathodoluminescence collection of the lens system is substantially greater than or equal to 50%.

14. The apparatus of claim 8, wherein the switchable optical element includes a dichroic mirror or a grating.

15. The apparatus of claim 14, wherein the dichroic mirror is a 50/50 beam splitter.

16. The apparatus of claim 14, further comprising:

a band-selection slit disposed between the grating and the detector.

17. The apparatus of claim 8, wherein the detector comprises a photon detector.

18. A wafer and a device under test (DUT) inspection method, comprising:

providing a wafer and DUT inspection apparatus, wherein the wafer and DUT inspection apparatus comprises:

a vacuum chamber, comprising:

a stage disposed in the vacuum chamber and near a first end of the vacuum chamber;

an electron gun disposed in the vacuum chamber and near a second end of the vacuum chamber opposite to the first end;

a lens system disposed between the stage and the electron gun, wherein the lens system is a total reflective achromatic lens system comprising:

a first lens having a first aperture; and a second lens having a second aperture aligned with the first aperture, the second lens is disposed between the electron gun and the first lens; and an optical mirror disposed between the lens system and the electron gun, wherein the optical mirror has a slit aligned with the second aperture;

a switchable optical element horizontally aligned with the optical mirror and configured to guide cathodoluminescence reflected from the optical mirror, wherein the switchable optical element is switched between a dichroic mirror and a grating;

a detector aligned with the switchable optical element, wherein the detector is configured to detect the cathodoluminescence; and a laser source aligned with the switchable optical element for emitting laser light toward to the switchable optical element, wherein the laser light is guided to the optical mirror by the switchable optical element;

placing a semiconductor wafer or DUT on the stage;

performing a first switching process to switch the switchable optical element to the dichroic mirror;

performing a positioning process to the semiconductor wafer or DUT by using the laser light after the first switching process is performed, wherein a first luminescence emitted from an excited area of the semiconductor wafer or DUT is guided to the detector so as to form a first image, thereby positioning an observing area of the semiconductor wafer or DUT; and performing an inspecting process to the observing area by continuously applying an E-beam so as to excite the observing area to emit a second luminescence, wherein the second luminescence is guided to the detector for forming a second image.

19. The method of claim 18, after the positioning process is performed, the method further comprises:

performing a second switching process to switch the dichroic mirror to the grating so as to form a third image during the E-beam is continuously applied to the observing area.

20. The method of claim 18, after the positioning process is performed, the method further comprises:

applying electronic currents to the observing area so as to form a fourth image after the E-beam is continuously applied to the observing area.

* * * * *